(12) United States Patent
Nakamura et al.

(10) Patent No.: US 10,074,700 B2
(45) Date of Patent: Sep. 11, 2018

(54) DISPLAY DEVICE AND HEAD MOUNTED DISPLAY DEVICE

(71) Applicant: Japan Display Inc., Tokyo (JP)

(72) Inventors: Tomoki Nakamura, Tokyo (JP); Jun Hanari, Tokyo (JP)

(73) Assignee: Japan Display Inc., Tokyo (JP)

( * ) Notice: Subject to any disclaimer, the term of this patent is extended or adjusted under 35 U.S.C. 154(b) by 102 days.

(21) Appl. No.: 15/242,685

(22) Filed: Aug. 22, 2016

(65) Prior Publication Data

US 2017/0061578 A1    Mar. 2, 2017

(30) Foreign Application Priority Data

Aug. 25, 2015 (JP) .................................. 2015-165429

(51) Int. Cl.
*G06T 17/00* (2006.01)
*H01L 27/32* (2006.01)

(52) U.S. Cl.
CPC .................................. *H01L 27/322* (2013.01)

(58) Field of Classification Search
None
See application file for complete search history.

(56) References Cited

U.S. PATENT DOCUMENTS

| 2010/0149073 | A1* | 6/2010 | Chaum | ............... | G02B 27/0093 |
| | | | | | 345/8 |
| 2014/0266990 | A1* | 9/2014 | Makino | ................ | G02B 27/017 |
| | | | | | 345/8 |
| 2016/0055822 | A1* | 2/2016 | Bell | .................... | G02B 27/0172 |
| | | | | | 345/207 |

FOREIGN PATENT DOCUMENTS

| JP | 2003-228040 A | 8/2003 |
| JP | 2013-117553 A | 6/2013 |

* cited by examiner

*Primary Examiner* — Peter Hoang
(74) *Attorney, Agent, or Firm* — Typha IP LLC

(57) ABSTRACT

A display device includes a low-definition display section and a high-definition display section. An area of pixels of the high-definition display section is smaller than an area of pixels of the low-definition display section. The position of the center of the high-definition display section is shifted from the position of the center of the display region. Consequently, when the display device is worn on the head of a user and disposed in front of the eyes, it is possible to provide a high-definition image. It is possible to reduce a processing load of moving image processing.

15 Claims, 16 Drawing Sheets

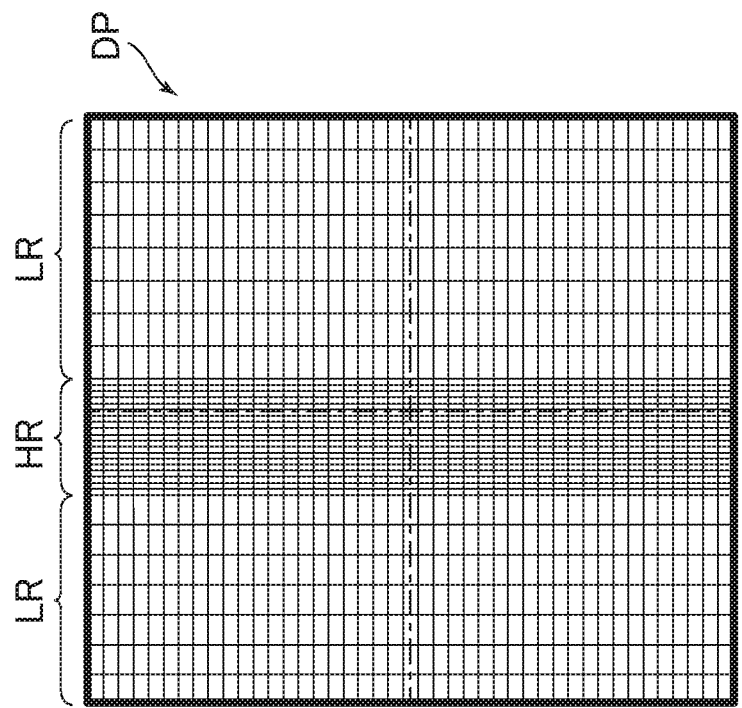
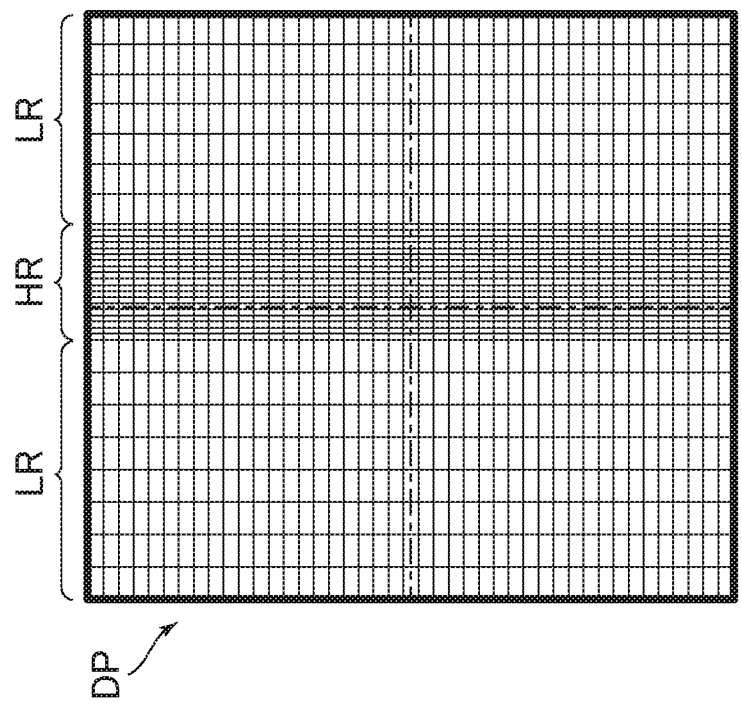
FIG.9

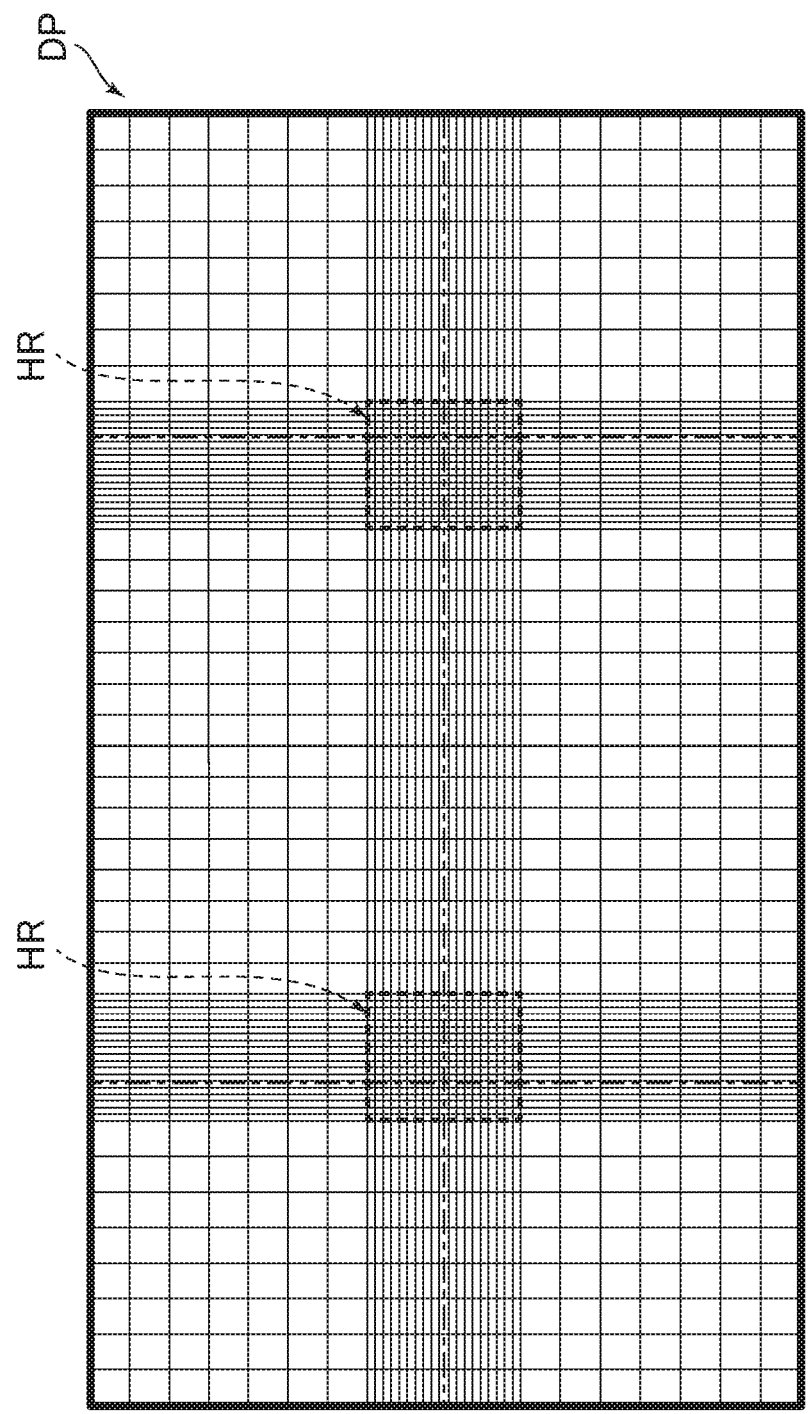

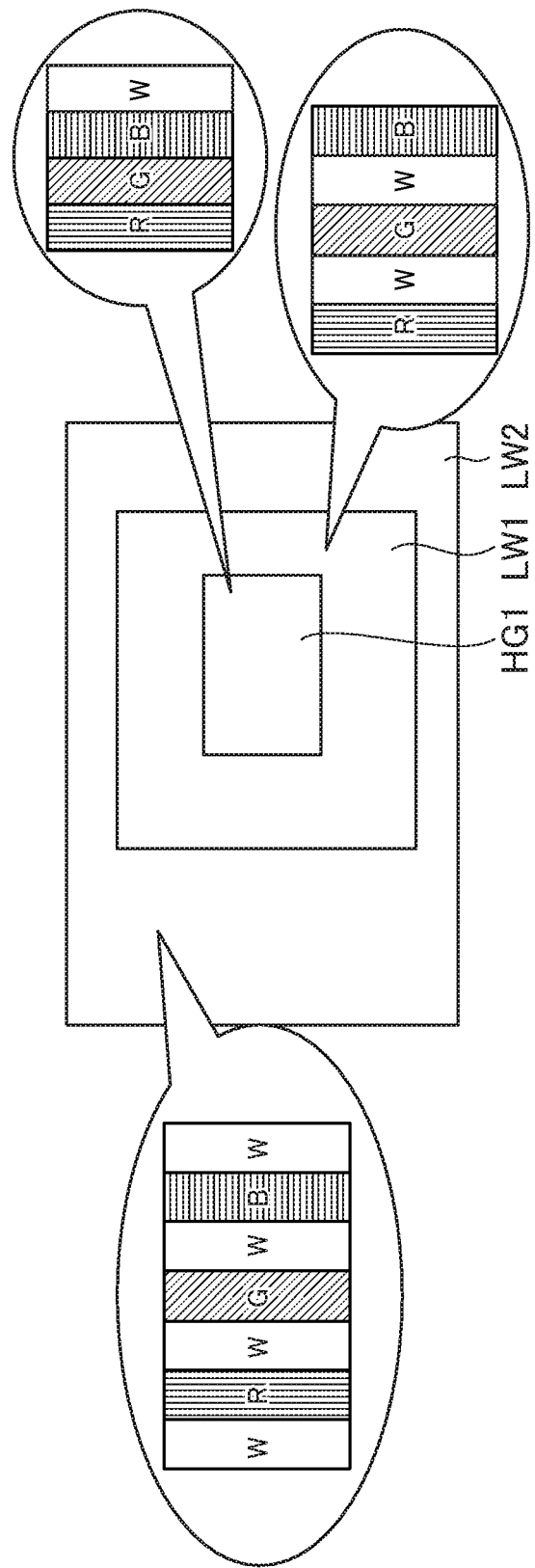

DISPLAY DEVICE AND HEAD MOUNTED DISPLAY DEVICE

CROSS-REFERENCE TO RELATED APPLICATION

The present application claims priority from Japanese application JP2015-165429 filed on Aug. 25, 2015, the content of which is hereby incorporated by reference into this application.

BACKGROUND OF THE INVENTION

1. Field of the Invention

The present invention relates to a display device and a head mounted display device.

2. Description of the Related Art

There is known a head mounted display device (referred to as HMD as well) configured to provide an image on a display disposed in front of the eyes.

JP 2013-117553 discloses an image display device that enables users to observe a realistic image displayed on a screen by increasing the screen in size and reduces manufacturing cost of the image display device and an amount of image data used during driving of the image display device.

SUMMARY OF THE INVENTION

Since head mounted display devices provide users with a large angular field of view despite its screen size, an angular field of view per one pixel is also large. Accordingly, head mounted display devices have an increasing demand for higher definition image.

However, when the higher definition in the head mounted display devices is further proceeded and performance for moving images and performance for three-dimensional displays are improved, a processing load imposed on the display device increases excessively.

In view of the problems described above, an object of the present invention is to provide a display device that can provide a high-definition image and reduce a processing load for moving image. Another object of the present invention is to provide a head mounted display device that can provide a high-definition image and reduce a processing load for moving image.

A display device according to the present invention includes: a display region; a low-definition display section provided in the display region and including a plurality of pixels; and a high-definition display section provided in the display region and including a plurality of pixels each having an area smaller than an area of each of the pixels of the low-definition display section. The position of the center of the high-definition display section is shifted from the position of the center of the display region.

A display device according to the present invention includes: a display region including a first region and a second region divided by a center line; a first low-definition display section provided in the first region and including a plurality of pixels; a first high-definition display section provided in the first region and including a plurality of pixels each having an area smaller than an area of each of the pixels of the first low-definition display section; a second low-definition display section provided in the second region and including a plurality of pixels; and a second high-definition display section provided in the second region and including a plurality of pixels each having an area smaller than an area of each of the pixels of the second low-definition display section. The center of the first high-definition display section is disposed toward the center line from the center of the first region. The center of the second high-definition display section is disposed toward the center line from the center of the second region.

BRIEF DESCRIPTION OF THE DRAWINGS

FIG. 9 is a diagram for explaining layouts of pixels of a display device for the left eye and a display device for the right eye in the second embodiment;

FIG. 11 is a diagram for explaining a layout of pixels of a display region in a fourth embodiment;

FIG. 15 is a diagram for explaining a color filter in a display device according to an eighth embodiment.

DETAILED DESCRIPTION OF THE INVENTION

Organic EL display devices according to embodiments of the present invention will be explained below with reference to the drawings.

First Embodiment

Figure 1:
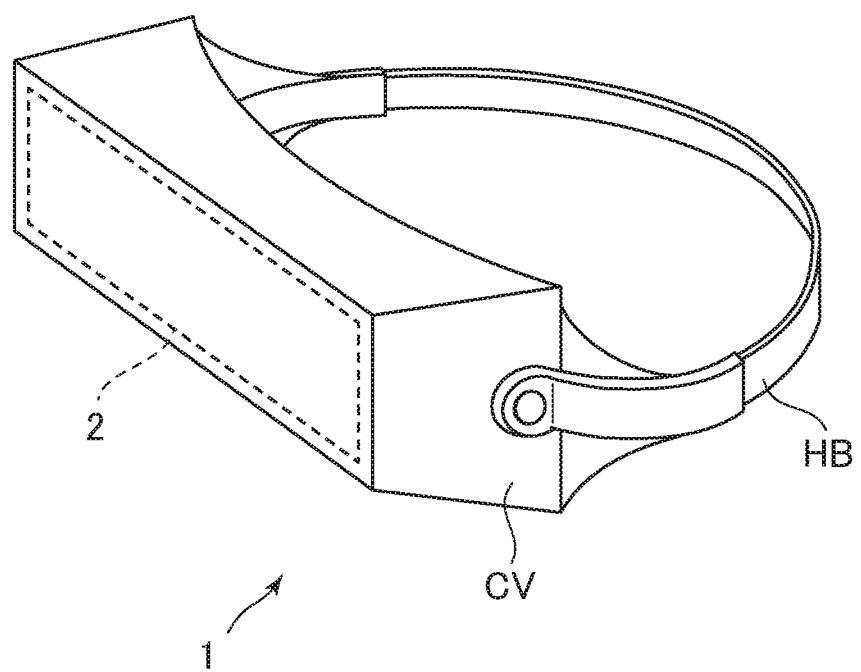
FIG. 1 is a perspective view of a headmounted display according to a first embodiment.

FIG. 1 is a perspective view for explaining a head mounted display 1 (a head mounted display device) according to a first embodiment. As shown in the figure, the head mounted display 1 according to the present embodiment includes an annular headband HB that can be locked to the head of a user, a cover member CV supported by the headband HB to cover the front of the eyes of the user, and a display device 2 detachably fixed (or integrally fixed) in front of the eyes of the user on the inside of the cover member CV.

The head mounted display 1 includes a not-shown receiving section to which an image signal and a sound signal are input. An image is displayed on the display device 2 on the basis of the image signal input to the receiving section. Sound is output from a not-shown speaker or the like on the basis of the sound signal input to the receiving section.

Figure 2:
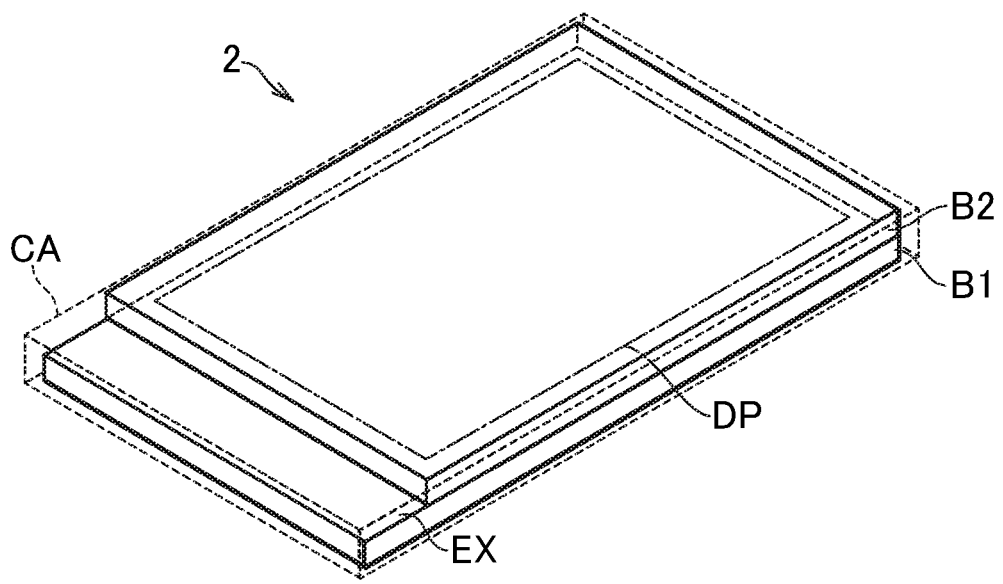
FIG. 2 is a schematic diagram of a display device according to a first embodiment.

FIG. 2 is a schematic perspective view for explaining the display device 2 installed on the inside of the cover member CV of the head mounted display 1 according to the present embodiment. The display device 2 according to this embodiment is an organic electroluminescence display device configured by attaching a second substrate B2 to a first substrate B1 having organic electroluminescence elements as a plurality of self-light emitting elements, and covering the outside of the attached substrates with a case CA. The first substrate B1 includes a region exposed from the second substrate B2 (an exposed region EX). An input terminal and the like for supplying a signal and electric power to the display device 2 are formed on the exposed region EX.

Figure 3:
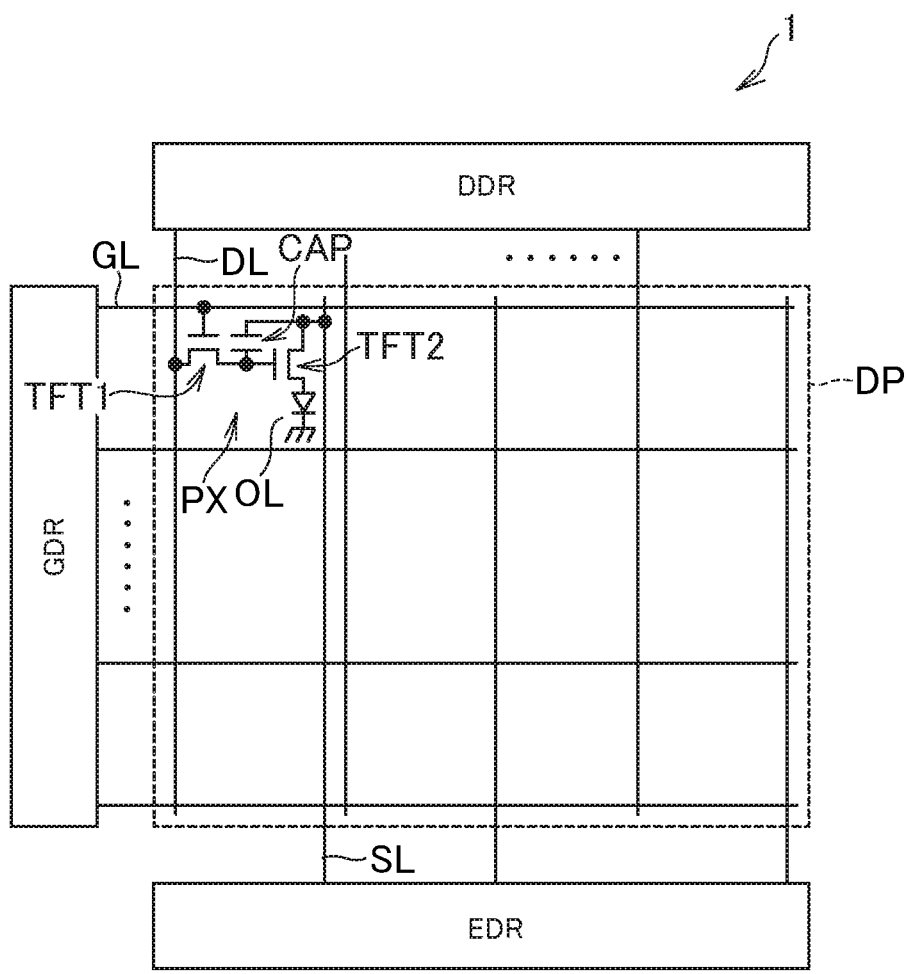
FIG. 3 is a schematic diagram showing a state of a pixel circuit of the display device in the first embodiment.

FIG. 3 is a diagram showing a pixel circuit in a display region DP of the display device 2 according to the first embodiment. The display device 2 includes the display region DP for displaying an image, a scanning-signal-line driving section GDR, a video-signal-line driving section DDR, and a power-supply driving section EDR.

The display region DP includes organic electroluminescence elements OL and pixel circuits PX in each of the plurality of pixels. The organic electroluminescence elements OL and the pixel circuits PX are arranged like a matrix. The pixel circuits PX include thin-film transistors TFT1, capacitative elements CAP, and thin-film transistors TFT2. The scanning-signal-line driving section GDR, the video-signal-line driving section DDR, and the power-supply driving section EDR drive the pixel circuits PX to control light emission of the organic electroluminescence elements OL.

The scanning-signal-line driving section GDR is connected to scanning signal lines GL provided for respective rows in the horizontal direction of the pixels (pixel rows). The scanning-signal-line driving section GDR outputs scanning signals to the scanning signal lines GL selected in order.

The video-signal-line driving section DDR is connected to video signal lines DL provided for the respective rows in the vertical direction of the pixels (pixel columns). The video-signal-line driving section DDR outputs, according to selection of the scanning signal lines GL by the scanning-signal-line driving section GDR, a voltage corresponding to a video signal of a selected pixel row to the video signal lines DL. The voltage is applied to the capacitative elements CAP in the pixel circuits PX. An electric current corresponding to the applied voltage is supplied to the organic electroluminescence elements OL.

The power-supply driving section EDR is connected to driving power supply lines SL provided for the respective pixel columns. The power-supply driving section EDR supplies an electric current to the organic electroluminescence elements OL via the thin-film transistors TFT2 in the pixel circuits PX.

A fixed potential, for example, ground potential is applied to cathodes of the organic electroluminescence elements OL. The cathodes of the organic electroluminescence elements OL of all the pixels are configured by a common electrode.

Figure 4:
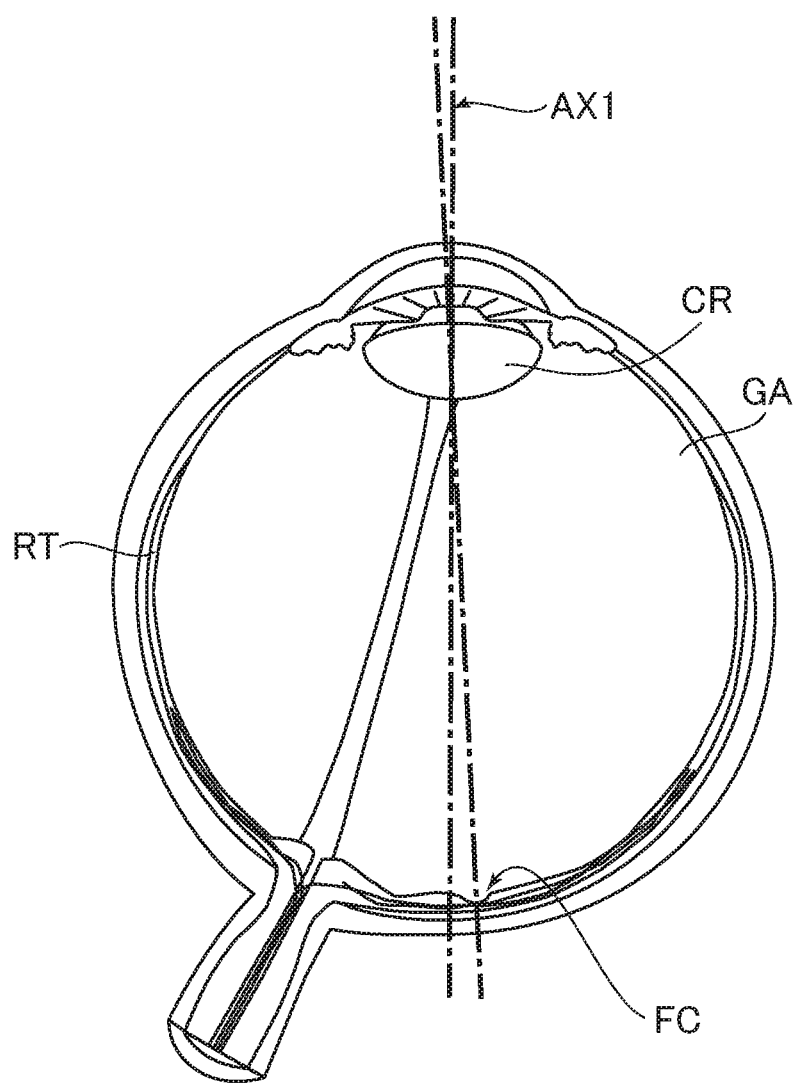
FIG. 4 is a diagram for explaining a state of eyes, which are organs that control the visual sense of a human.

FIG. 4 is a diagram for explaining a cross section of the eyeball (the right eye) of a human. As shown in the figure, the eyeball of the human includes a crystalline lens CR, a vitreous body GA, and a retina RT. A central fovea FC is located in the center of the macular coloboma of the retina RT. The central fovea FC includes, at high density, pyramidal cells which has high resolution in color discriminating function but having low sensitivity. Rod cells having low resolution, not having the color discrimination function, and having high sensitivity are present at high density on the outer side of the central fovea FC.

As shown in FIG. 4, the central fovea FC is located in a place shifted from an optical axis AX of the eyeball optical system. It is known that, the right eyeball has the central fovea FC shifted to the right side from the optical axis AX by several degrees and, the left eyeball has the central fovea FC shifted to the left side from the optical axis AX by several degrees (4 degrees or more and 8 degrees or less).

When the head mounted display is used for virtual reality or the like, the positions of the display device 2 and the eyeballs of the user are extremely close. Accordingly, it is assumed that, when a user changes gazing position, visual point does not greatly move and the positions of the eyeball optical system and the central fovea FC with respect to the display device 2 are almost fixed.

Figure 5:
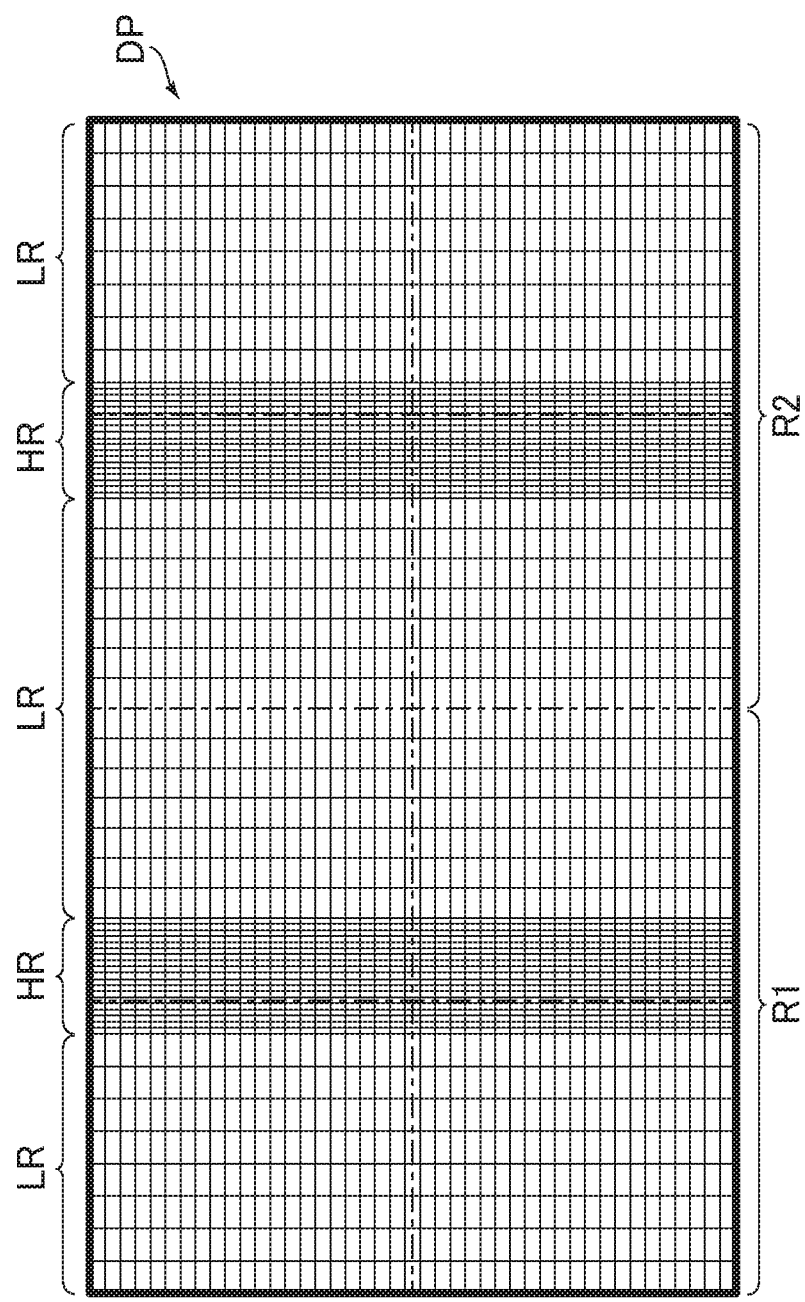
FIG. 5 is a diagram for explaining a layout of pixels of a display region in the first embodiment.

Therefore, in the display device 2 according to the present embodiment, as shown in a pixel layout diagram of the display region DP shown in FIG. 5, high definition portions (high-definition display sections HR) and other sections (low-definition display sections LR) are provided in each of a region on the left side of the center of the display region DP having a laterally long rectangular shape (a first region R1 for supplying an image to the left eye) and a region on the right side of the center (a second region R2 for supplying an image to the right eye). The centers of the high definition portions are located toward the center line of the display region DP from the center of the first region and the second region. The high-definition display sections HR are symmetrically disposed with respect to the center line of the laterally long display region DP. In the low-definition display sections LR, the size of the pixels is larger than the size in the high-definition display sections HR.

In the display device 2 according to this embodiment, the high definition pixels and the low definition pixels are laid out as shown in FIG. 5. Consequently, a low-definition image is provided to the rod cells located on the outer side of the central fovea FC and having low resolution and a high-definition image is provided to the pyramidal cells of the central fovea FC having high resolution, which reduces a processing load of moving image such as virtual reality.

A sectional view of the pixel of the high-definition display section HR located near the boundary with the low-definition display section LR of the display device 2 according to the present embodiment will be explained with reference to FIG. 6. As shown in the figure, the display device 2 according to this embodiment includes the first substrate B1 having the plurality of organic electroluminescence elements OL formed thereon and configured by polyimide and the second substrate B2 having a color filter layer CF and a black matrix BM formed thereon. The first substrate B1 and the second substrate B2 sandwich a filler FL.

The organic electroluminescence element OL includes a pixel electrode P1, an organic layer E1, and a common electrode C1. The organic electroluminescence element OL has a wiring layer L1 and a capacitative insulation layer CP for forming the capacitative element CAP together with the pixel electrode P1. The capacitative insulation layer CP is formed by an inorganic insulation film such as silicon nitride (SiNx). A planarization layer HPL formed of an organic insulation film such as acrylic resin or polyimide resin is formed as an undercoat layer for the organic electroluminescence element OL. The pixels (the organic electroluminescence elements OL) are separated from one another by a bank layer BNK formed of the same organic insulation film.

The pixel electrode P1 (an anode) of the organic electroluminescence element OL is a reflection electrode formed in a three-layer laminated structure including, for example, indium tin oxide (hereinafter, ITO), silver, and ITO. The pixel electrode P1 is connected to a first transparent conductive film T1 formed of ITO extending from the bottom of a contact hole CH. The pixel electrode P1 and the first transparent conductive film T1 are connected via an opening formed in the capacitative insulation layer CP. In the contact hole CH, the inner side of the first transparent conductive film T1 is covered by the capacitative insulation layer CP.

The pixel electrode P1 is electrically connected to a source electrode of the thin-film transistor TFT2 formed below the planarization layer HPL. The common electrode C1 is formed by a transparent conductive film such as ITO into one-layer over all pixels in the display region DP.

The organic layer E1 in the present embodiment is formed between the common electrode C1 and the pixel electrode P1 and includes a hole transport layer, a light emitting layer, and an electron transport layer. Holes injected from the pixel electrode P1 and electrons injected from the common electrode C1 recombine in the light emitting layer in the organic layer E1 to thereby emit light. All layers configuring the organic layer E1 may be formed over the entire display region DP or may be individually formed for each of the pixels. The luminance of the light emitting layer of the organic electroluminescence element OL is controlled by an electric current from the thin-film transistor TFT2.

The organic electroluminescence elements OL of the pixels are covered with a sealing layer PA and protected. The sealing layer PA in the present embodiment is configured by an inorganic insulation film. Specifically, the sealing layer PA includes a silicon nitride layer or a silicon oxide layer.

In the display device 2 according to this embodiment, the display region DP of the first substrate B1 has a plurality of sectioned regions where the pixel circuits PX. The plurality of sectioned regions are partitioned like a lattice by a plurality of scanning signal lines and a plurality of video signal lines to have an equal area. The thin-film transistors TFT1 and TFT2 of the pixel circuit PX are formed at uniform density at equal intervals. On the other hand, the pixels of the display region DP (that is, the density of a pixel in layers upper than the planarization film HPL) varies in density such that the display region DP includes the high-definition display sections HR and the low-definition display sections LR. The size of the pixel electrode P1 changes according to the density of the pixels.

Figure 6:
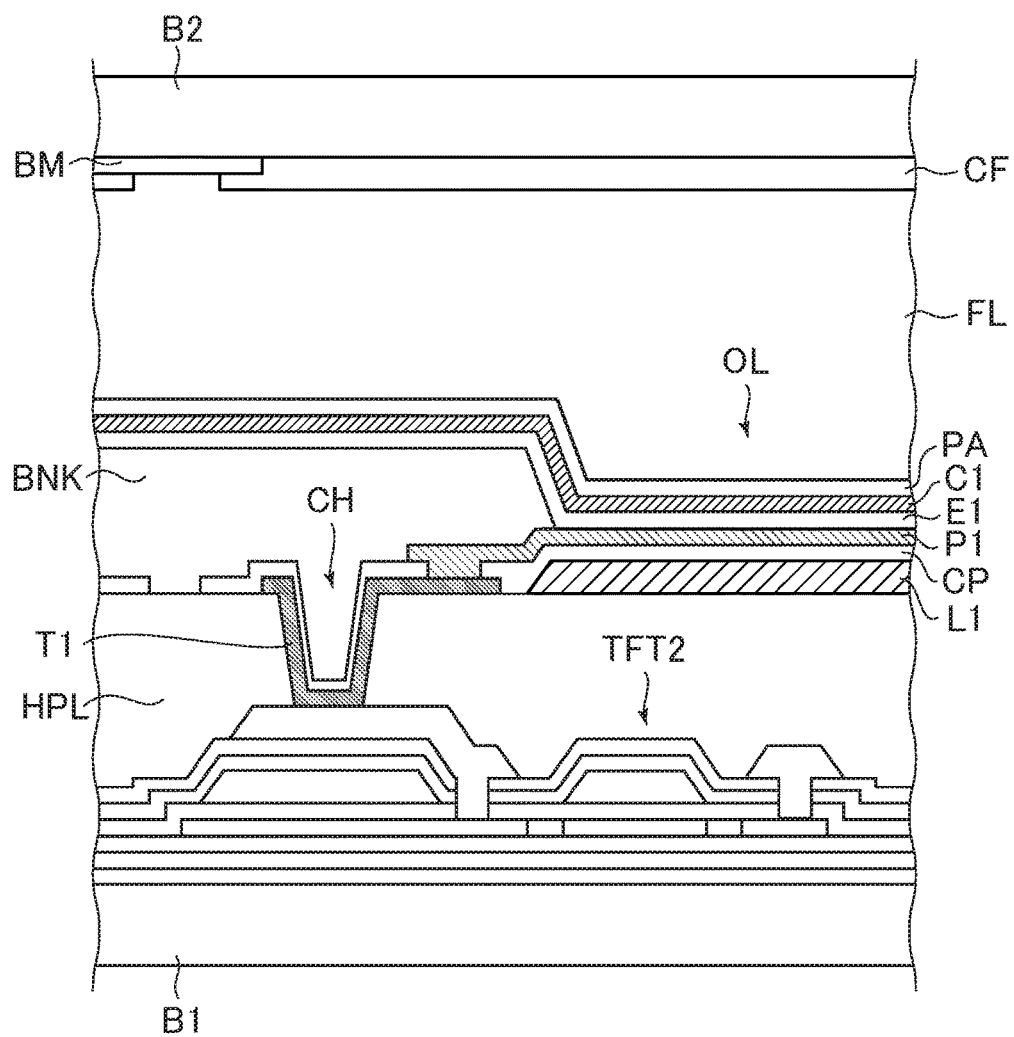
FIG. 6 is a diagram for explaining a cross section in a predetermined position of the display device according to the first embodiment.

Therefore, as shown in FIG. 6, the pixel electrode P1 of the high-definition display section HR in the present embodiment is connected to the first transparent conductive film T1 drawn from the contact hole CH formed at the position of the thin-film transistor TFT2 in the first substrate B1. A positional difference between the disposition of the pixel electrode P1 and the thin-film transistor TFT2 is compensated by the first transparent conductive film T1. The first transparent conductive film T1 drawn in a layer upper than the planarization film HPL easily realizes the display region DP including the high-definition display sections HR and the low-definition display sections LR shown in FIG. 5.

Figure 7:
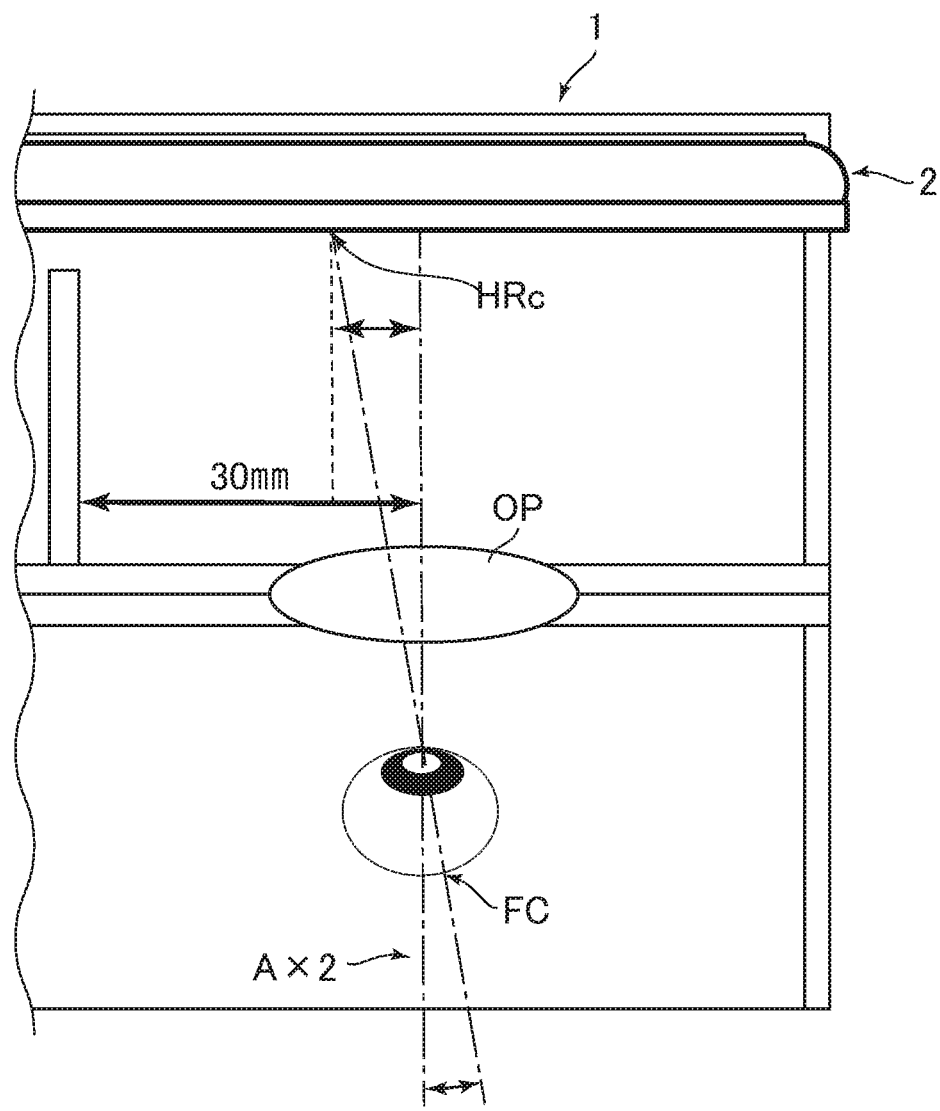
FIG. 7 is a diagram for explaining the structure of the head mounted display according to the first embodiment.

FIG. 7 is a schematic diagram for explaining the structure of the head mounted display 1 according to the present embodiment. As shown in the figure, the center of the high-definition display section of the display device 2 is located toward the center of the display device 2 from an optical axis AX2 of an optical system (that is, an eyepiece) OP of the head mounted display 1 which is provide between the display device 2 and the eye of the user. The optical axis AX2 of the optical system OP of the head mounted display 1 according to the present embodiment is separate from the center of the head mounted display 1 by approximately 30 mm (The center of the head mounted display 1 is the center line of the head of the user). The display device 2 and the optical system OP are separate by approximately 35 mm from each other. The center HRc of the high-definition display section HR is separate in the horizontal direction by 3.0 mm or more and 8.5 mm or less from the optical axis AX2. Preferably, the center HRc of the high-definition display section HR is separate by a size of 3.8 mm or more and 7.7 mm or less from the optical axis AX2. Since, as described above, the center of the high-definition display section is shifted toward the center of the laterally long display region DP in conformity with the position of the central fovea FC in the eyeball of the user (that is, a position shifted by 4 to 8 degrees from the optical axis AX1), it is possible to reduce processing load of moving image while providing a high-definition image to the user.

Second Embodiment

The head mounted display 1 according to a second embodiment of the present invention will be explained.

Figure 8:
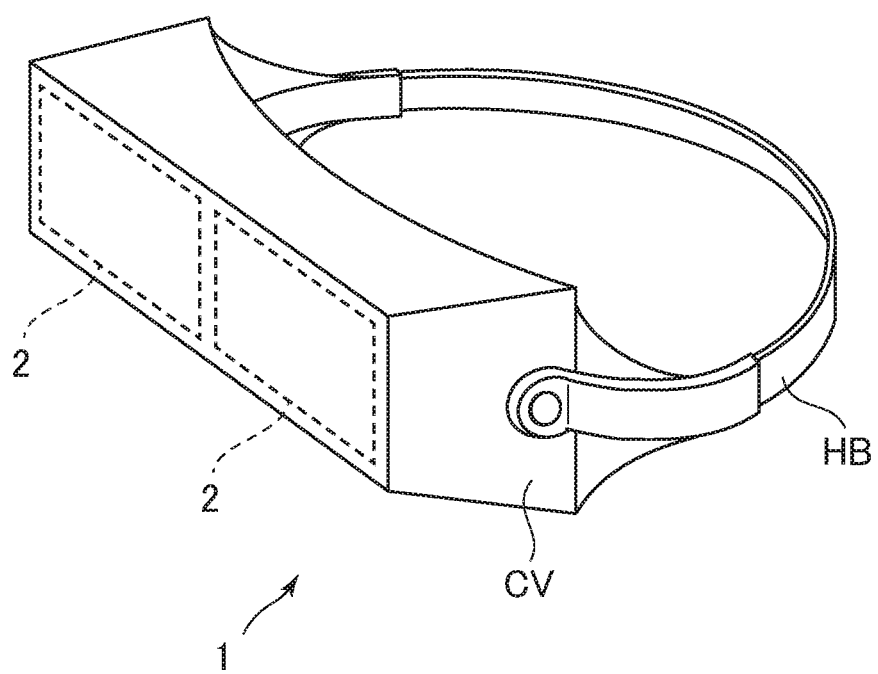
FIG. 8 is a perspective view of a headmounted display according to a second embodiment.

FIG. 8 is a perspective view of the head mounted display 1 according to the second embodiment. FIG. 9 is a diagram for explaining a layout of pixels of the display device 2 according to the second embodiment.

As shown in FIG. 8, the head mounted display 1 according to the second embodiment includes two display devices 2 corresponding to the two eyes of a human on the inside of the cover member CV. The display device 2 disposed in front of the left eye of the display devices 2 has a layout of pixels shown on the left side in FIG. 9. The display device 2 disposed in front of the right eye has a layout of pixels shown on the right side in FIG. 9.

In the two display devices 2, as in the case of the first embodiment, the high-definition display sections HR having an area of a unit pixel smaller than the area of the other sections (that is, low-definition display sections) are arranged symmetrically about the center of the head mounted display. The center of the high-definition display section HR in the display device 2 disposed in front of the left eye is located toward the right eye from the center of the display device 2. The center of the high-definition display section HR in the display device 2 disposed in front of the right eye is located toward the left eye from the center of the display device 2. In the present embodiment, the two display devices 2 can employ the same display device. when the two display devices 2 employs the same display device, the two display devices 2 only need to be arranged such that display surfaces thereof are directed in the same direction and one display device 2 is rotated 180 degrees with respect to the other display device 2. In the second embodiment, a display device smaller than the display device according to the first embodiment can be used as the display devices 2.

The head mounted display 1 according to the second embodiment is different from the head mounted display 1 according to the first embodiment in the points explained above. The head mounted display 1 according to the second embodiment is the same as the head mounted display 1 according to the first embodiment in other points. Therefore, explanation of the other points is omitted.

Third Embodiment

A head mounted display 1 according to a third embodiment of the present invention will be explained.

Figure 10:
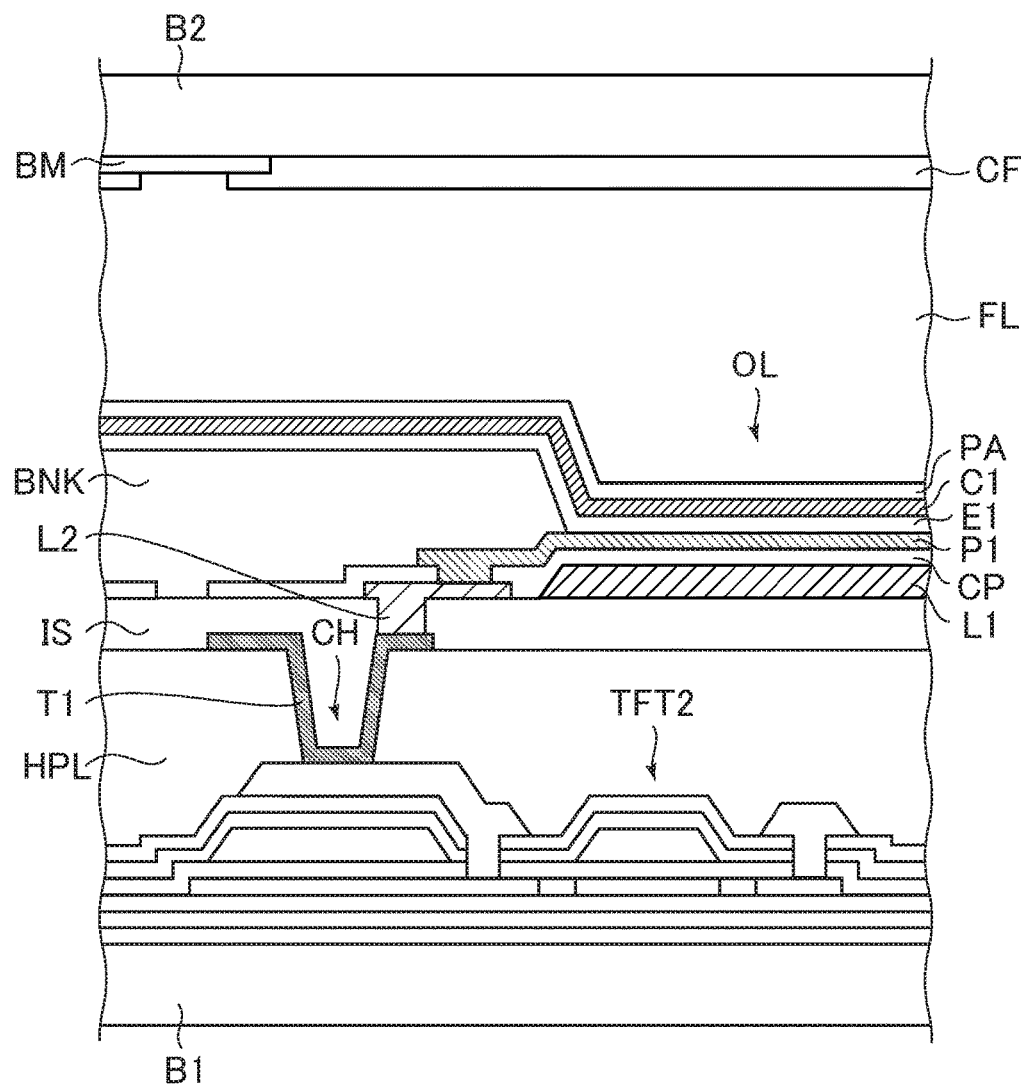
FIG. 10 is a diagram for explaining a cross section in a predetermined position of a display device according to a third embodiment.

FIG. 10 is a diagram for explaining a cross section of a pixel of the high-definition display section HR near the boundary between the high-definition display section HR and the low-definition display section LR of the display device 2 according to the third embodiment. In the display device 2 according to the third embodiment, a drawn wiring layer L2 is further interposed between the first transparent conductive film T1 and the pixel electrode P1. Consequently, the display device 2 can also be adapted to a pixel layout having a larger distance between the thin-film transistor TFT2 and the pixel electrode P1. In other words, even in a circuit design in which regions surrounded by the video signal lines DL and the scanning signal lines GL has areas equal to each other, it is possible to achieve higher definition by reduce the size of the pixel electrode P1 of the high-definition display section HR.

Specifically, an insulation layer IS is further disposed in a layer upper than the planarization film HPL. The drawn wiring layer L2 and the first transparent conductive film T1 are connected via a contact hole drilled in the insulation layer IS. The drawn wiring layer L2 and the pixel electrode P1 are connected via a contact hole drilled in the capacitative insulation layer CP. Note that the first transparent conductive film T1 and the pixel electrode P1 may be connected via a larger number of wiring layers and insulation layers.

The head mounted display 1 according to the third embodiment is different from the head mounted display 1 according to the first and second embodiments in the points explained above. However, the head mounted display 1 according to the third embodiment is the same as the head mounted display 1 according to the first and second embodiments in other points. Therefore, explanation of the other points is omitted.

Fourth Embodiment

The head mounted display 1 according to a fourth embodiment of the present invention will be explained.

FIG. 11 is a diagram showing a layout of pixels in the display region DP of the display device 2 according to the fourth embodiment.

In the display region DP in the first embodiment, the density of the pixels changes in the lateral direction. The display device 2 according to the fourth embodiment is different in that the density of the pixels changes not only in the lateral direction but also in the longitudinal direction. Each of two high-definition regions HR are slightly shifted toward the center of the display region DP and have an area per one pixel smaller than the area of other sections (that is, low-definition display sections). The high-definition regions HR is arranged in conformity with the central fovea of the human.

The head mounted display 1 according to the fourth embodiment is different from the head mounted display 1 according to the first embodiment in the points explained above. The head mounted display 1 according to the fourth embodiment is the same as the head mounted display 1 according to the first embodiment in other points. Therefore, explanation of the other points is omitted. Note that, in the head mounted display 1 according to the second embodiment, the density of the pixels may change not only in the lateral direction but also in the longitudinal direction.

Fifth Embodiment

The head mounted display 1 according to a fifth embodiment of the present invention will be explained.

Figure 12A:
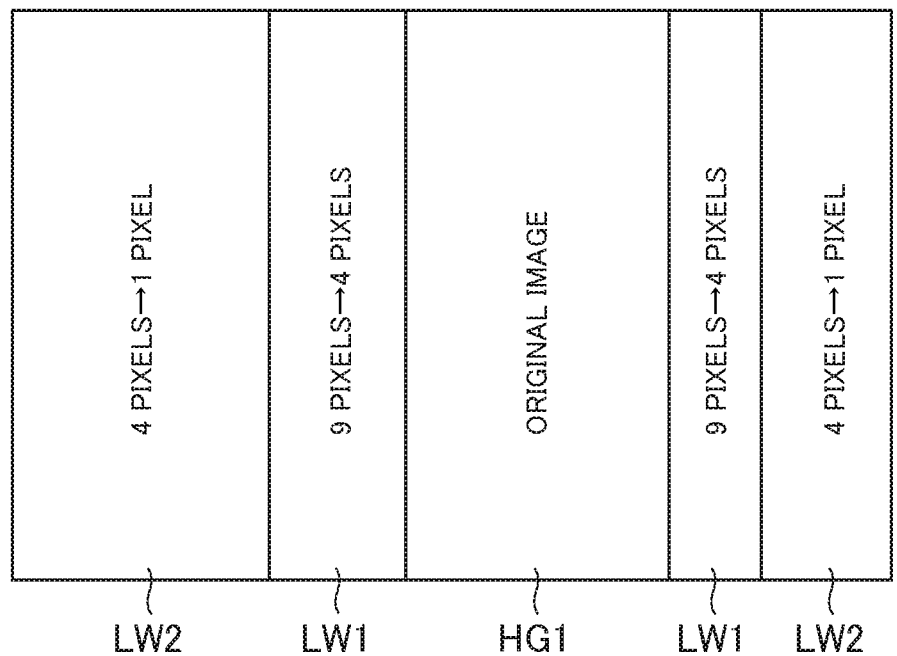
FIG. 12A is a diagram for explaining video signal processing in a display device according to a fifth embodiment.

FIG. 12A is a diagram for explaining an image in the display region DP (the display device 2) for the left eye and output from the video-signal-line driving section DDR. The image is made by Resolution conversion processing from an original image. Processing for converting nine pixels (three pixels×three pixels) of the original image into four pixels (two pixels×two pixels) is performed for a region LW1 corresponding to a part of the low-definition display section LR. Processing for converting four pixels (two pixels×two pixels) of the original image into one pixel is performed for a region LW2 corresponding to a remaining part of the low-definition display section LR. In other words, processing for setting a value obtained by averaging pixel values of the original image for the nine pixels to a pixel value of each of four pixels overlapping the nine pixels is performed for the region LW1. Further, processing for setting a value obtained by averaging pixel values of the original image for the four pixels to a pixel value of each of the pixel values of the four pixels is performed for the region LW2. In a region HG1 corresponding to the high-definition display section HR, conversion of resolution is not performed and the original image is displayed as it is. In this way, in the fifth embodiment, images displayed in the high-definition display sections HR and the low-definition display section LR are converted according to a unit area of the pixels. Therefore, the processing load of the moving image is further reduced.

Figure 12B:
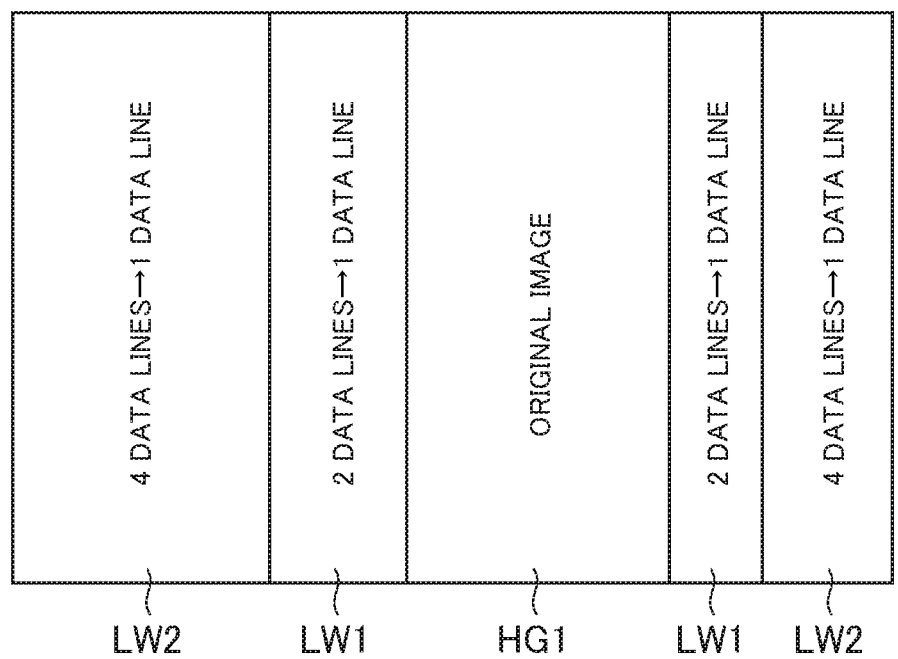
FIG. 12B is a diagram for explaining a modification of the video signal processing in the display device according to the fifth embodiment.

FIG. 12B is a diagram for explaining an image subjected to resolution conversion in a modification of the fifth embodiment. For the region LW1 in the figure, pixel values output from two video signal lines DL are averaged to produce one pixel value. For the region LW2, pixel values output from four video signal lines Dl are averaged to produce one pixel value is output. In the region HG1, pixel values output from the video signal lines DL are not averaged and pixel values same as the pixel values of the original image are output. Even in such a conversion, images displayed in the high-definition display section HR and the low-definition display sections LR are converted according to the area of the pixels. Therefore, the processing load of the moving image is further reduced.

Note that, in the fifth embodiment, the resolution of image data in regions other than the high-definition display section HR is reduced step by step for the regions LW1 and LW2. Similarly, in the region HG1 corresponding to the high-definition display section HR, the resolution may be improved step by step. The image may be converted such that the resolution is gradually improved toward the center of the high-definition display section HR.

The head mounted display 1 according to the fifth embodiment is different from the head mounted display 1 according to the first and second embodiments in the points explained above. However, the head mounted display 1 according to the fifth embodiment is the same as the head mounted display 1 according to the first and second embodiments in other points. Therefore, explanation of the other points is omitted. Note that pixel data in the fifth embodiment may be applied to the layout of pixels in the fourth embodiment (FIG. 11).

Sixth Embodiment

The head mounted display 1 according to a sixth embodiment of the present invention will be explained.

Figure 13:
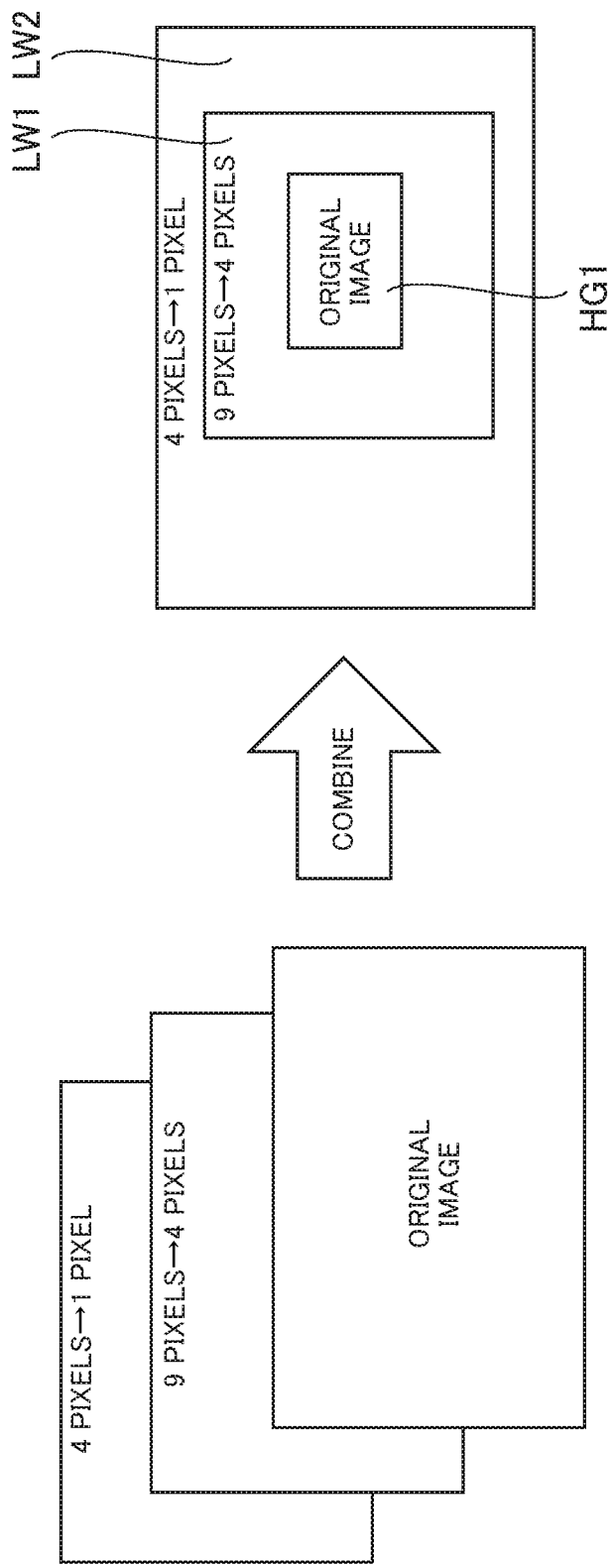
FIG. 13 is a diagram for explaining a modification of video signal processing in a display device according to a sixth embodiment.

FIG. 13 is a diagram for explaining image data in the display region DP (the display device 2) corresponding to the left eye in the display device 2 according to the sixth embodiment. In the sixth embodiment, as in the fifth embodiment, original image data, image data converted such that a pixel value obtained by averaging pixel values of nine pixels (three pixels×three pixels) is applied to pixel values of four pixels (two pixels×two pixels), and image data converted such that a pixel value obtained by averaging pixel values of four pixels (two pixels×two pixels) is applied to a pixel value of one pixel are used as an image data output from the video-signal-line driving section DDR. The image data output from the video-signal-line driving section DDR is image data obtained by combining these image data.

As shown in FIG. 13, the image data output from the video-signal-line driving section DDR in the sixth embodiment has the region HG1 overlapping the center of the high-definition display section HR and the regions LW1 and LW2 surrounding the region HG1 in the up and down direction and in the left and right direction. The resolution of the image data decreases further away from the center of the high-definition display section HR.

The head mounted display 1 according to the sixth embodiment is different from the head mounted display 1 according to the first and second embodiments in the points explained above. The head mounted display 1 according to the sixth embodiment is the same as the head mounted display 1 according to the first and second embodiments in other points. Therefore, explanation of the other points is omitted. Note that pixel data in the sixth embodiment may be applied to the layout of pixels in the fourth embodiment (FIG. 11).

Seventh Embodiment

The head mounted display 1 according to a seventh embodiment of the invention will be explained.

Figure 14:
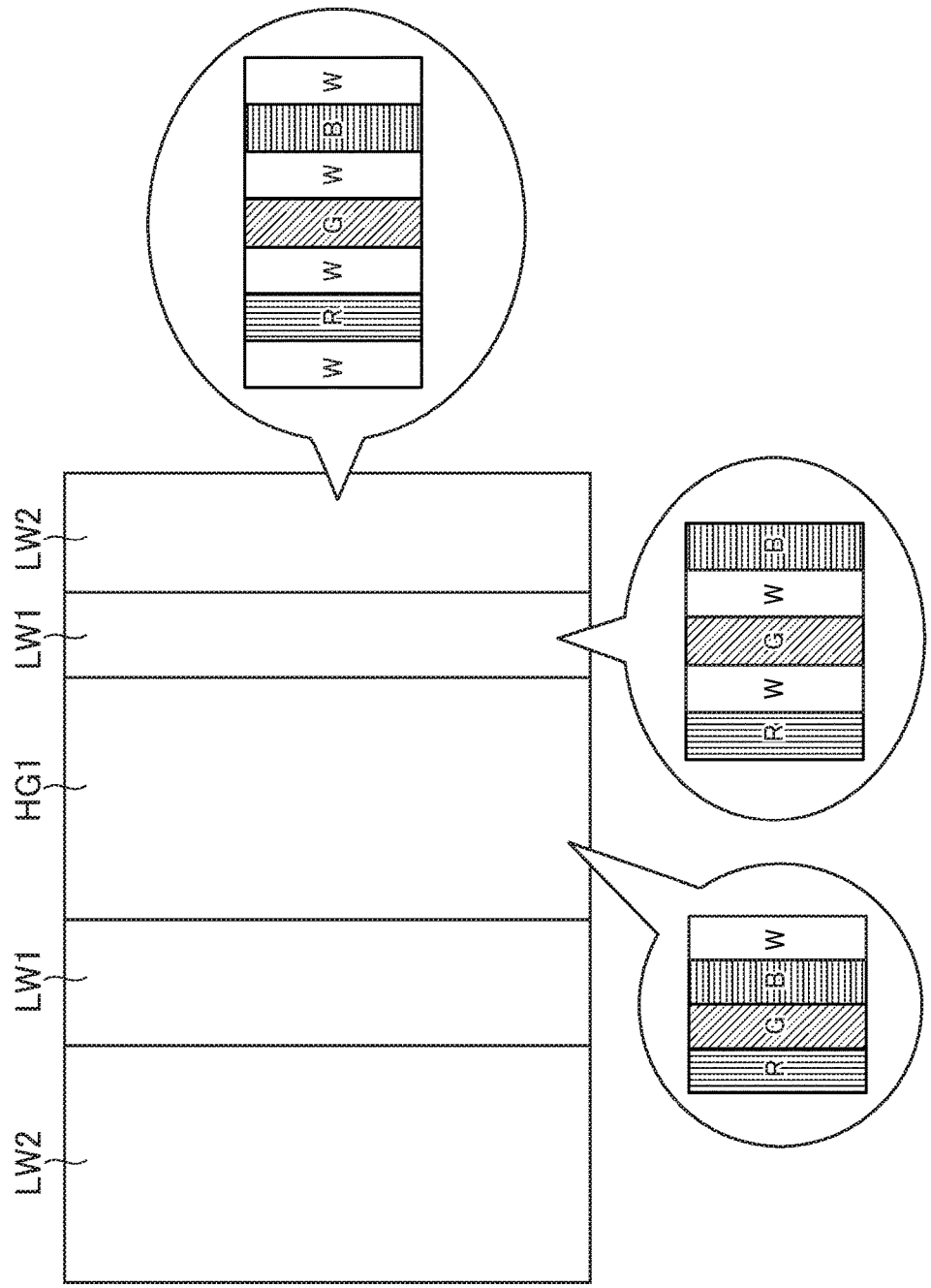
FIG. 14 is a diagram for explaining a color filter in a display device according to a seventh embodiment.

FIG. 14 is a diagram for explaining a color filter in the display region DP (the display device 2) for the left eye in the display device 2 according to the seventh embodiment.

The color filter in the display region DP in the seventh embodiment is configured by four colors of R (red), G (green), B (blue), and W (white) in the region HG1 corresponding to the high-definition display section. The regions LW1 and LW2 corresponding to the low-definition display sections LR increase an area of W (or the number of pixels of W) in a unit pixel while increasing a distance from the region HG1 corresponding to the high-definition display section HR. Specifically, a proportion of the numbers of sub-pixels having an equal area is R:G:B:W=1:1:1:1 in the region HG1, R:G:B:W=1:1:1:2 in the region LW1, and R:G:B:W=1:1:1:4 in the region LW2.

As described above, white portions of the pixels in the regions LW1 and LW2 corresponding to the low-definition display sections LR are larger than a white portion in the region HG1 corresponding to the high-definition display section HR. Therefore, light transmittance per a unit area is improved. Light use efficiency of a backlight and the like in the low-definition display section LR is improved.

The head mounted display 1 according to the seventh embodiment is different from the head mounted display 1 according to the first and second embodiments in the points explained above. However, the head mounted display 1 according to the seventh embodiment is the same as the head mounted display 1 according to the first and second embodiments in other points. Therefore, explanation of the other points is omitted.

Eighth Embodiment

The head mounted display 1 according to an eighth embodiment of the present invention will be explained.

FIG. 15 is a diagram for explaining a state of a color filter in the display region DP (the display device 2) corresponding to the left eye in the display device 2 according to the eighth embodiment.

In the color filter in the display region DP in the eighth embodiment, as in the color filter in the seventh embodiment, the color filter is configured by the four colors of RGBW in the region HG1 corresponding to the high-definition display section HR. The regions LW1 and LW2 corresponding to the sections other than the high-definition display section HR increase an area of W in a unit pixel while increasing a distance from the region HG1.

Note that, in improving the light transmittance per a unit area and improving the light use efficiency, as in the seventh and eighth embodiments, a ratio of an area of a white pixels in one pixel may be increased to reduce color reproducibility and chroma. Alternatively, chromaticity of the color filter in the regions LW1 and LW2 may be reduced (color component materials of the color filter may be reduced from the color component materials in the region HG1 to bring the pixel close to white). Concerning the size of sub-pixels configuring a main pixel, the sub-pixels do not have to be set to the same area and may be set to different areas. When a sub-pixel is added other than RGB, the sub-pixel may be a colored layer other than W. For example, a sub-pixel colored the same as G may be added to reduce chroma and improve the light transmittance.

The head mounted display 1 according to the eighth embodiment is different from the head mounted display 1 according to the first and second embodiments in the points explained above. However, the head mounted display 1 according to the eighth embodiment is the same as the head mounted display 1 according to the first and second embodiments in other points. Therefore, explanation of the other points is omitted. Note that the color filter in the eighth embodiment may be applied to the layout of pixels in the fourth embodiment (FIG. 11).

Note that, the above described embodiments adopts a circuit design where the display region is partitioned like a lattice by the plurality of scanning signal lines GL and the plurality of video signal lines DL into partitioned regions having an equal area and includes the high-definition display sections HR and the like defined by an arrangement and a size of the pixel electrodes P1. However, wires formed in a layer lower than the planarization film HPL, such as the scanning signal lines GL and the video signal lines DL, may be laid according to the arrangement of the pixel electrodes P1 (that is, according to a pixel arrangement formed above the planarization film HPL) in FIGS. 5 and 9.

Note that, in the above described embodiments, the pixel electrodes P1 are arrayed to have an equal area in the high-definition display sections HR and in the other sections (that is, the low-definition display sections LR) as shown in FIGS. 5, 9, and 11. However, for example, the size of the pixels may change in each of the high-definition display sections HR and the low-definition display sections LR. Alternatively, the pixels of the high-definition display section HR and the low-definition display section LR may be reduced in size toward predetermined positions in the high-definition display sections HR.

Note that the display device 2 in the above described embodiments is the organic EL display device. However, the display device 2 is not limited to the organic EL display device and only has to be a self-light emitting display device and may be a display device including, in pixels, self-light emitting elements such as quantum-dot light emitting diodes (QLED). The display device 2 may be other display devices such as a liquid crystal display device as long as the high-definition display sections HR and the low-definition display sections LR can be formed according to a layout of the pixel circuits PX on which TFTs and the like are disposed. In other words, the display device 2 may be other display devices such as a liquid crystal display device as long as a circuit can be laid out to dispose opening of pixels according to each of the high-definition display sections HR and the low-definition display sections LR.

The present invention is not limited to the embodiments and various modifications are possible. Those skilled in the art can arrive at various variations and corrections within the category of the idea of the present invention. It is understood that the variations and the corrections also belong to the scope of the present invention. For example, appropriate addition, deletion, or a design change of constituent elements or addition, omission, or a condition change of steps by those skilled in the art concerning the embodiments are also included in the scope of the present invention as long as the addition, the deletion, or the design change of the constituent elements or the addition, the omission, or the condition change of the steps include the gist of the present invention.

What is claimed is:

1. A head mounted display device comprising:
   a first display device in front of a left eye of a user;
   a second display device in front of a right eye of the user,
   a first optical system disposed between the left eye of the user and the first display device in front of the left eye, and
   a second optical system disposed between the right eye of the user and the second display device in front of the right eye,
   each of the first display device and the second display device comprises:
   a display region;
   a low-definition display section provided in the display region and including a plurality of pixels; and
   a high-definition display section provided in the display region and including a plurality of pixels each having an area smaller than an area of each of the pixels of the low-definition display section, wherein
   a center of the high-definition display section of the first display device is positioned toward the second display device from a center of the first display device, and is shifted by 3.0 mm or more and 8.5 mm or less from an optical axis of the first optical system, and
   a center of the high-definition display section of the second display device is positioned toward the first display device from a center of the second display device, and is shifted by 3.0 mm or more and 8.5 mm or less from an optical axis of the second optical system.

2. The head mounted display device according to claim 1, further comprising a video-signal processing circuit configured to output image data to be displayed in the display region, wherein
   the video-signal processing circuit outputs the image data such that resolution in the high-definition display section is higher than resolution in the low-definition display section.

3. The head mounted display device according to claim 1, further comprising a color filter substrate including a coloring layer for coloring an image in the display region, wherein
   on the color filter substrate, the coloring layer is disposed such that light transmittance per a unit area of the low-definition display section is higher than light transmittance per a unit area in the high-definition display section.

4. The head mounted display device according to claim 1, further comprising a thin-film transistor substrate configured to control driving of the plurality of pixels in the display region, wherein
   the thin-film transistor substrate includes:
   a plurality of sectioned regions partitioned like a lattice respectively by a plurality of scanning signal lines and a plurality of video signal lines to have an equal area;
   a high-definition pixel electrode disposed in each pixel of the high-definition display section and according to a size of each pixel in the high-definition display section, the high-definition pixel electrode being connected with a wire drawn from a thin-film transistor in the sectioned region; and
   a low-definition pixel electrode disposed in each pixel of the low-definition display section and according to a size of each pixel in the low-definition display section, the low-definition pixel electrode being connected with a wire drawn from a thin-film transistor in the sectioned region.

5. The display device according to claim 1, wherein
   both of the low-definition display section and the high-definition display section are provided in the display region defined on an insulated surface on a common substrate.

6. A head mounted display device comprising:
   a display device in front of eyes of a user;
   a first optical system between in front of left eye of the user and the display device; and
   a second optical system between in front of right eye of the user and the display device,
   the display device comprises:
   a display region including a first region and a second region divided by a center line;
   a first low-definition display section provided in the first region and including a plurality of pixels; a first high-definition display section provided in the first region and including a plurality of pixels each having an area smaller than an area of each of the pixels of the first low-definition display section; and
   a second low-definition display section provided in the second region and including a plurality of pixels; and
   a second high-definition display section provided in the second region and including a plurality of pixels each having an area smaller than an area of each of the pixels of the second low-definition display section, wherein
   a center of the first high-definition display section is positioned toward the center line from a center of the first region, and is shifted by 3.0 mm or more and 8.5 mm or less from an optical axis of the first optical system, and
   a center of the second high-definition display section is positioned toward the center line from a center of the second region, and is shifted by 3.0 mm or more and 8.5 mm or less from an optical axis of the second optical system.

7. The head mounted display device according to claim 6, further comprising a video-signal processing circuit configured to output image data to be displayed in the display region, wherein
   the video-signal processing circuit outputs the image data such that resolution in the first high-definition display section is higher than resolution in the first low-definition display section and resolution in the second high-definition display section is higher than resolution in the second low-definition display section.

8. The head mounted display device according to claim 6, further comprising a color filter substrate including a coloring layer for coloring an image in the display region, wherein
on the color filter substrate, the coloring layer is disposed such that light transmittance per a unit area of the first low-definition display section is higher than light transmittance per a unit area in the first high-definition display section and light transmittance per a unit area of the second low-definition display section is higher than light transmittance per a unit area in the second high-definition display section.

9. The head mounted display device according to claim 6, further comprising a thin-film transistor substrate configured to control driving of the plurality of pixels in the display region, wherein
the thin-film transistor substrate includes:
a plurality of sectioned regions partitioned like a lattice respectively by a plurality of scanning signal lines and a plurality of video signal lines to have an equal area;
a high-definition pixel electrode disposed in each pixel of the first high-definition display section and the second high-definition display section and according to a size of each pixel in the first high-definition display section and the second high-definition display section, the high-definition pixel electrode being connected with a wire drawn from a thin-film transistor in the sectioned region; and
a low-definition pixel electrode disposed in each pixel of the first low-definition display section and the second low-definition display section and according to a size of each pixel in the first low-definition display section and the second low-definition display section, the low-definition pixel electrode being connected with a wire drawn from a thin-film transistor in the sectioned region.

10. The head mounted display device according to claim 6, wherein
the first low-definition display section, the first high-definition display section, the second low-definition display section, and the second high-definition display section are provided in the display region provided on an insulated surface on a common substrate.

11. A display device comprising:
a display region including a first region and a second region divided by a center line;
a first low-definition display section provided in the first region and including a plurality of pixels;
a first high-definition display section provided in the first region and including a plurality of pixels each having an area smaller than an area of each of the pixels of the first low-definition display section;
a second low-definition display section provided in the second region and including a plurality of pixels; and
a second high-definition display section provided in the second region and including a plurality of pixels each having an area smaller than an area of each of the pixels of the second low-definition display section, wherein
a center of the first high-definition display section is positioned toward the center line from a center of the first region, and is shifted by 3.0 mm or more and 8.5 mm or less from the center of the first region, and
a center of the second high-definition display section is positioned toward the center line from a center of the second region, and is shifted by 3.0 mm or more and 8.5 mm or less from the center of the second region.

12. The head mounted display device according to claim 11, further comprising a video-signal processing circuit configured to output image data to be displayed in the display region, wherein
the video-signal processing circuit outputs the image data such that resolution in the first high-definition display section is higher than resolution in the first low-definition display section and resolution in the second high-definition display section is higher than resolution in the second low-definition display section.

13. The head mounted display device according to claim 11, further comprising a color filter substrate including a coloring layer for coloring an image in the display region, wherein
on the color filter substrate, the coloring layer is disposed such that light transmittance per a unit area of the first low-definition display section is higher than light transmittance per a unit area in the first high-definition display section and light transmittance per a unit area of the second low-definition display section is higher than light transmittance per a unit area in the second high-definition display section.

14. The head mounted display device according to claim 11, further comprising a thin-film transistor substrate configured to control driving of the plurality of pixels in the display region, wherein
the thin-film transistor substrate includes:
a plurality of sectioned regions partitioned like a lattice respectively by a plurality of scanning signal lines and a plurality of video signal lines to have an equal area;
a high-definition pixel electrode disposed in each pixel of the first high-definition display section and the second high-definition display section and according to a size of each pixel in the first high-definition display section and the second high-definition display section, the high-definition pixel electrode being connected with a wire drawn from a thin-film transistor in the sectioned region; and
a low-definition pixel electrode disposed in each pixel of the first low-definition display section and the second low-definition display section and according to a size of each pixel in the first low-definition display section and the second low-definition display section, the low-definition pixel electrode being connected with a wire drawn from a thin-film transistor in the sectioned region.

15. The head mounted display device according to claim 11, wherein
the first low-definition display section, the first high-definition display section, the second low-definition display section, and the second high-definition display section are provided in the display region provided on an insulated surface on a common substrate.

* * * * *